(12) United States Patent
Liang et al.

(10) Patent No.: US 10,804,678 B2
(45) Date of Patent: Oct. 13, 2020

(54) DEVICES WITH QUANTUM DOTS

(71) Applicant: Hewlett Packard Enterprise Development LP, Houston, TX (US)

(72) Inventors: Di Liang, Santa Barbara, CA (US); Geza Kurczveil, Santa Barbara, CA (US); Raymond G. Beausoleil, Palo Alto, CA (US); Marco Fiorentino, Mountain View, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/132,070

(22) Filed: Sep. 14, 2018

(65) Prior Publication Data
US 2019/0089129 A1 Mar. 21, 2019

Related U.S. Application Data

(62) Division of application No. 15/140,588, filed on Apr. 28, 2016, now Pat. No. 10,109,983.

(51) Int. Cl.
*H01S 5/343* (2006.01)
*H01S 5/32* (2006.01)
(Continued)

(52) U.S. Cl.
CPC ........... *H01S 5/343* (2013.01); *H01S 3/0637* (2013.01); *H01S 3/2375* (2013.01); *H01S 5/021* (2013.01);
(Continued)

(58) Field of Classification Search
CPC .......... H01S 5/0206–021; H01S 5/0215–0216; H01S 5/0218; H01S 5/0201–0203;
(Continued)

(56) References Cited

U.S. PATENT DOCUMENTS 5,757,027 A * 5/1998 Kuchta ............ G01R 31/2822
257/48
6,040,590 A * 3/2000 OBrien ................. H01S 5/0614
257/94
(Continued)

FOREIGN PATENT DOCUMENTS

CN 103843210 A 6/2014
EP 2988378 A1 * 2/2016 ............. H01S 5/021
(Continued)

OTHER PUBLICATIONS

Tanabe K., et al.; "High-Temperature 1.3 InAS/GaAs Quantum Dot Lasers on Si Substrates Fabricated by Wafer Bonding"; Applied Physics Express 6, Published on Jul. 25, 2013, pp. 082703-1-082703-4, The Japan Society of Applied Physics.
(Continued)

*Primary Examiner* — Joshua King
(74) *Attorney, Agent, or Firm* — Hewlett Packard Enterprise Patent Department

(57) ABSTRACT

An example method of manufacturing a semiconductor device. A first wafer may be provided that includes a first layer that contains quantum dots. A second wafer may be provided that includes a buried dielectric layer and a second layer on the buried dielectric layer. An interface layer may be formed on at least one of the first layer and the second layer, where the interface layer may be an insulator, a transparent electrical conductor, or a polymer. The first wafer may be bonded to the second wafer by way of the interface layer.

5 Claims, 10 Drawing Sheets

(51) Int. Cl.
   *H01S 5/347* (2006.01)
   *H01S 3/23* (2006.01)
   *H01S 3/063* (2006.01)
   *H01S 5/34* (2006.01)
   *H01S 5/02* (2006.01)
   *H01S 5/042* (2006.01)
   *H01S 5/026* (2006.01)
   *H01S 5/10* (2006.01)

(52) U.S. Cl.
   CPC .......... *H01S 5/0216* (2013.01); *H01S 5/0218* (2013.01); *H01S 5/0424* (2013.01); *H01S 5/3211* (2013.01); *H01S 5/347* (2013.01); *H01S 5/3412* (2013.01); *H01S 5/0261* (2013.01); *H01S 5/1032* (2013.01)

(58) Field of Classification Search
   CPC .... H01S 3/0637; H01S 3/2375; H01S 5/3412; H01S 5/343–36
   See application file for complete search history.

(56) References Cited

U.S. PATENT DOCUMENTS

| | | | |
|---|---|---|---|
| 6,085,237 A | 7/2000 | Durham et al. | |
| 6,487,354 B1 | 11/2002 | Ferm et al. | |
| 6,704,792 B1 | 3/2004 | Oswald | |
| 6,734,105 B2 | 5/2004 | Kim | |
| 6,774,448 B1* | 8/2004 | Lindemann | H01L 27/1463 257/438 |
| 6,902,987 B1* | 6/2005 | Tong | H01L 21/0206 438/455 |
| 7,244,679 B2 | 7/2007 | Koh | |
| 7,257,283 B1 | 8/2007 | Liu et al. | |
| 7,561,605 B1 | 7/2009 | Delfyett et al. | |
| 7,565,084 B1 | 7/2009 | Wach | |
| 7,627,018 B1 | 12/2009 | Guilfoyle et al. | |
| 7,653,106 B2 | 1/2010 | Arimoto | |
| 7,873,992 B1 | 1/2011 | Daily et al. | |
| 7,935,956 B2 | 5/2011 | Xie | |
| 8,110,823 B2 | 2/2012 | Bowers | |
| 9,065,572 B1 | 6/2015 | Wach | |
| 9,110,219 B1 | 8/2015 | Zhang et al. | |
| 9,166,363 B2 | 10/2015 | Jain | |
| 9,209,596 B1* | 12/2015 | McLaurin | H01S 5/0282 |
| 9,343,874 B2 | 5/2016 | Liu et al. | |
| 9,450,379 B2 | 9/2016 | Zhang et al. | |
| 9,494,734 B1 | 11/2016 | Jain et al. | |
| 9,509,122 B1* | 11/2016 | Norberg | H01S 5/3211 |
| 9,941,664 B1* | 4/2018 | Hahn | H01S 5/2054 |
| 2002/0040983 A1* | 4/2002 | Fitzergald | G02B 6/12 257/183 |
| 2003/0081642 A1* | 5/2003 | Hwang | H01S 5/18341 372/45.01 |
| 2003/0086635 A1* | 5/2003 | Bylsma | G02B 6/12004 385/14 |
| 2004/0037342 A1 | 2/2004 | Blauvelt et al. | |
| 2004/0114641 A1 | 6/2004 | Wise et al. | |
| 2004/0247005 A1* | 12/2004 | Schrodinger | H01S 5/0261 372/38.1 |
| 2006/0039424 A1 | 2/2006 | Thoma et al. | |
| 2007/0133632 A1 | 6/2007 | Doerr | |
| 2007/0170417 A1 | 7/2007 | Bowers | |
| 2008/0002929 A1 | 1/2008 | Bowers et al. | |
| 2008/0049802 A1 | 2/2008 | Kim et al. | |
| 2009/0032805 A1* | 2/2009 | Ty Tan | B82Y 20/00 257/25 |
| 2009/0154517 A1 | 6/2009 | Leem et al. | |
| 2009/0245298 A1 | 10/2009 | Sysak et al. | |
| 2009/0245316 A1 | 10/2009 | Sysak et al. | |
| 2009/0274411 A1 | 11/2009 | Bar et al. | |
| 2010/0111128 A1 | 5/2010 | Qin et al. | |
| 2010/0142973 A1 | 6/2010 | Gubenko et al. | |
| 2011/0080090 A1 | 4/2011 | Wood et al. | |
| 2011/0134939 A1 | 6/2011 | Zhang | |
| 2011/0163421 A1 | 7/2011 | Mi | |
| 2011/0299561 A1 | 12/2011 | Akiyama | |
| 2012/0008658 A1 | 1/2012 | Chung | |
| 2012/0063484 A1 | 3/2012 | Goddard et al. | |
| 2012/0093456 A1 | 4/2012 | Taillaert et al. | |
| 2012/0189317 A1 | 7/2012 | Heck et al. | |
| 2012/0205352 A1 | 8/2012 | Fermann | |
| 2012/0300796 A1 | 11/2012 | Sysak et al. | |
| 2012/0320939 A1 | 12/2012 | Baets et al. | |
| 2013/0107901 A1 | 5/2013 | Deppe | |
| 2013/0143336 A1 | 6/2013 | Jain | |
| 2013/0182730 A1 | 7/2013 | Fan et al. | |
| 2013/0259077 A1* | 10/2013 | Ben Bakir | G02B 6/12004 372/44.01 |
| 2014/0264031 A1 | 9/2014 | Fermann et al. | |
| 2014/0363127 A1 | 12/2014 | Baets et al. | |
| 2015/0111325 A1 | 4/2015 | Hsu et al. | |
| 2015/0139264 A1 | 5/2015 | Zhang et al. | |
| 2015/0177458 A1* | 6/2015 | Bowers | G02B 6/131 385/14 |
| 2015/0270684 A1* | 9/2015 | Suzuki | H01S 5/1237 372/45.012 |
| 2015/0333480 A1 | 11/2015 | Santis et al. | |
| 2016/0056612 A1 | 2/2016 | Ferrotti et al. | |
| 2016/0276807 A1* | 9/2016 | Cai | H01L 27/1207 |
| 2016/0334574 A1* | 11/2016 | Czornomaz | G02B 6/12004 |
| 2016/0356960 A1 | 12/2016 | Novack et al. | |
| 2017/0187161 A1 | 6/2017 | Fermann et al. | |
| 2017/0207600 A1* | 7/2017 | Klamkin | H01S 5/02292 |
| 2017/0212368 A1 | 7/2017 | Liang et al. | |
| 2017/0317471 A1* | 11/2017 | Lor | G02B 6/124 |
| 2018/0026830 A1 | 1/2018 | Bhatia et al. | |
| 2018/0090576 A1 | 3/2018 | Kim | |
| 2018/0191134 A1 | 7/2018 | Osinski et al. | |

FOREIGN PATENT DOCUMENTS

| | | |
|---|---|---|
| KR | 2000-0055239 A | 9/2000 |
| KR | 10-2015-0097306 A | 8/2015 |
| WO | 2016/011002 A1 | 1/2016 |
| WO | WO-2016018285 A1 | 2/2016 |

OTHER PUBLICATIONS

Moskalenko et al., "A Wide Bandwidth Coherent Optical Comb Source Based on a Monolithically Integrated Mode-Locked Ring Laser", Optical Fiber Communication Conference, Mar. 2014, 3 pages.

International Search Report and Written Opinion received for PCT Patent Application No. PCT/US18/53664, dated Feb. 28, 2019, 12 pages.

Delfyett et al., "Chirped pulse laser sources and applications", Progress in Quantum Electronics, vol. 36, Nov. 3, 2012, pp. 475-540.

Zhu et al., Ultrabroadband flat dispersion tailoring of dual-slot silicon waveguides, Optics Express, vol. 20, Issue 14, 2012, pp. 15899-15907.

Zhang et al., "Silicon waveguide with four zero-dispersion wavelengths and its application in on-chip octave-spanning supercontinuum generation", Optics Express, vol. 20, Issue 2, 2012, pp. 1685-1690.

Tang, M. et al., "Direct Integration of Quantum Dot Lasers on Silicon," (Research Paper), 18th European Conference on Integrated Optiics 2016, May 18-20, 2016, 2 pages, available at http://www.ecio-conferenee.org/wp-content/uploads/2016/06/EC10-1-04. pdf.

Tan et al., "Monolithic nonlinear pulse compressor on a silicon chip", Nature Communications, vol. 116, 2010, 6 pages.

Liu et al., "Quantum Dot Lasers for Silicon Photonics" Photon. Res., vol. 3, No. 5, Oct. 2015, pp. B1-B9.

Chang et al., "Optimization of Filtering Schemes for Broadband Astro-combs," (Research Paper), Optics Express, vol. 20, No. 22, Oct. 22, 2012, pp. 24987-25013.

"SnmpSharpNet", SNMP Library for C#, Project Updates, available online at <http://www.snmpsharpnet.com/?page_id=160&paged=2>, retrieved on Jun. 13, 2018, 8 pages.

(56) References Cited

OTHER PUBLICATIONS

Resan et al., "Dispersion-Managed Breathing-Mode Semiconductor Mode-Locked Ring Laser: Experimental Characterization and Numerical Simulations", IEEE Journal of Quantum Electronics, vol. 40, Issue 3, Mar. 2004, pp. 214-221.
Wing et al., "Improvement of Plasmonic Enhancement of Quantum Dot Emission via an Intermediate Silicon-aluminum Oxide Interface," Applied Physics Letters 106, AIP Publishing LLC, 2015, pp. 013105-1-013105-4.
Ting Wang, "High-Performance III-V Quantum-Dot Lasers Monolithically Grown on Si and Ge Substrates for Si Photonics," (Research Paper), University College of London, Feb. 2012, 160 pages.

\* cited by examiner

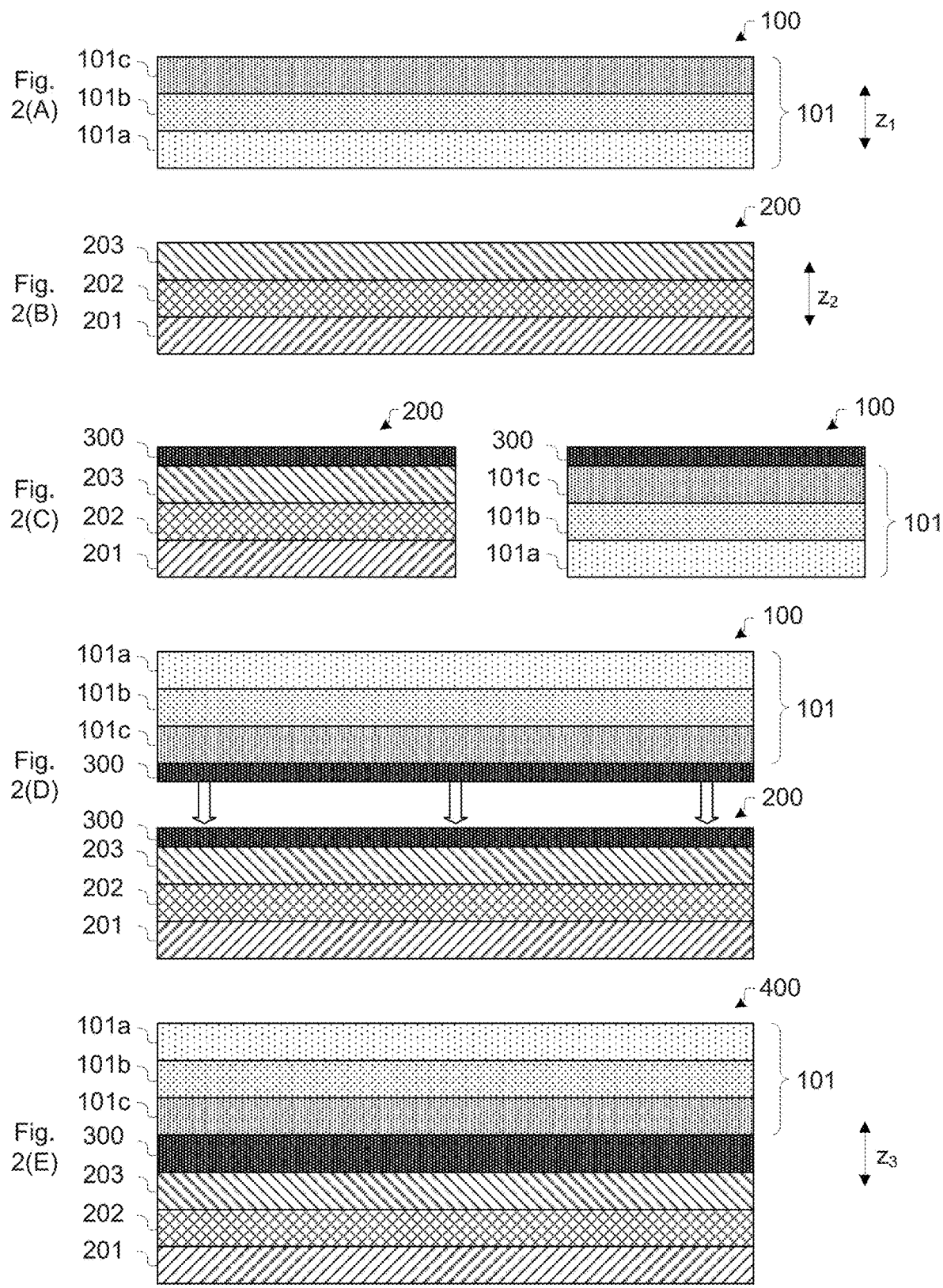

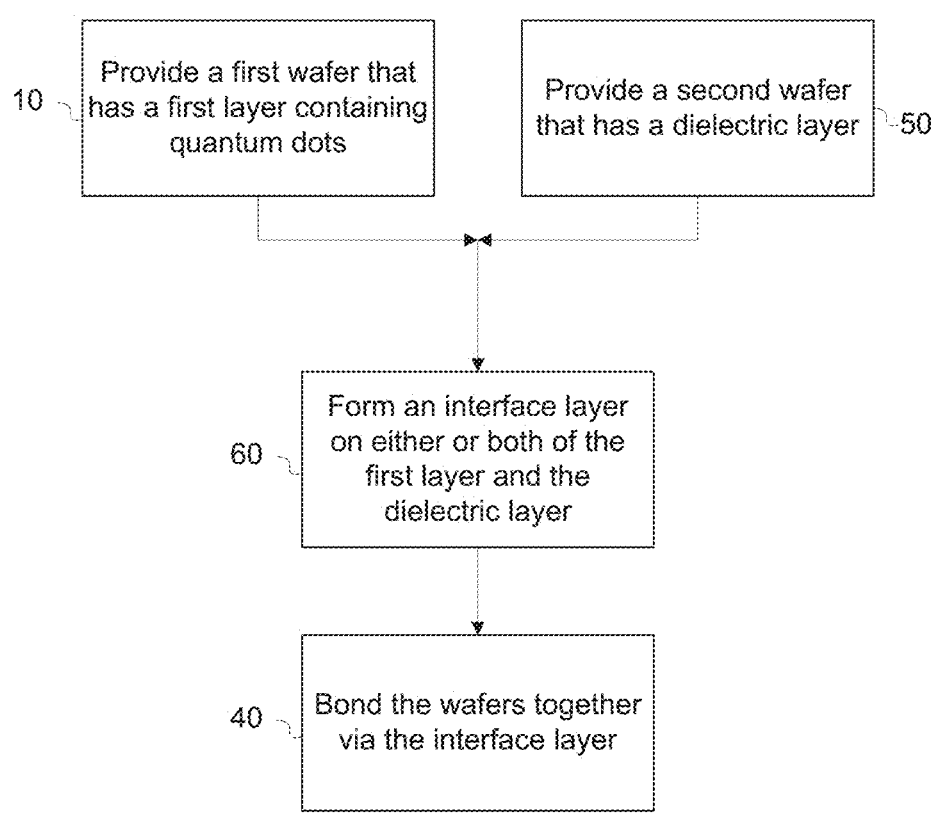

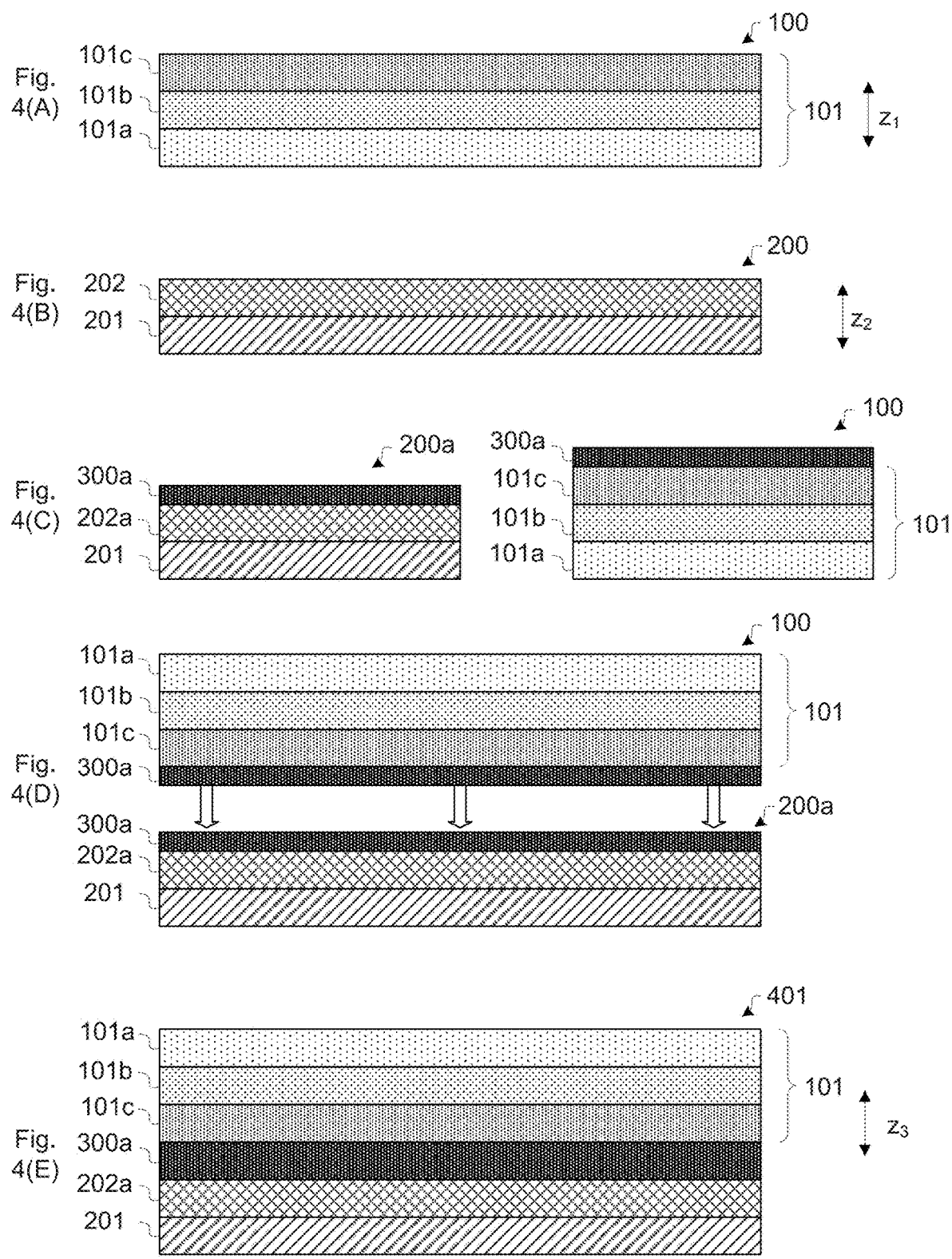

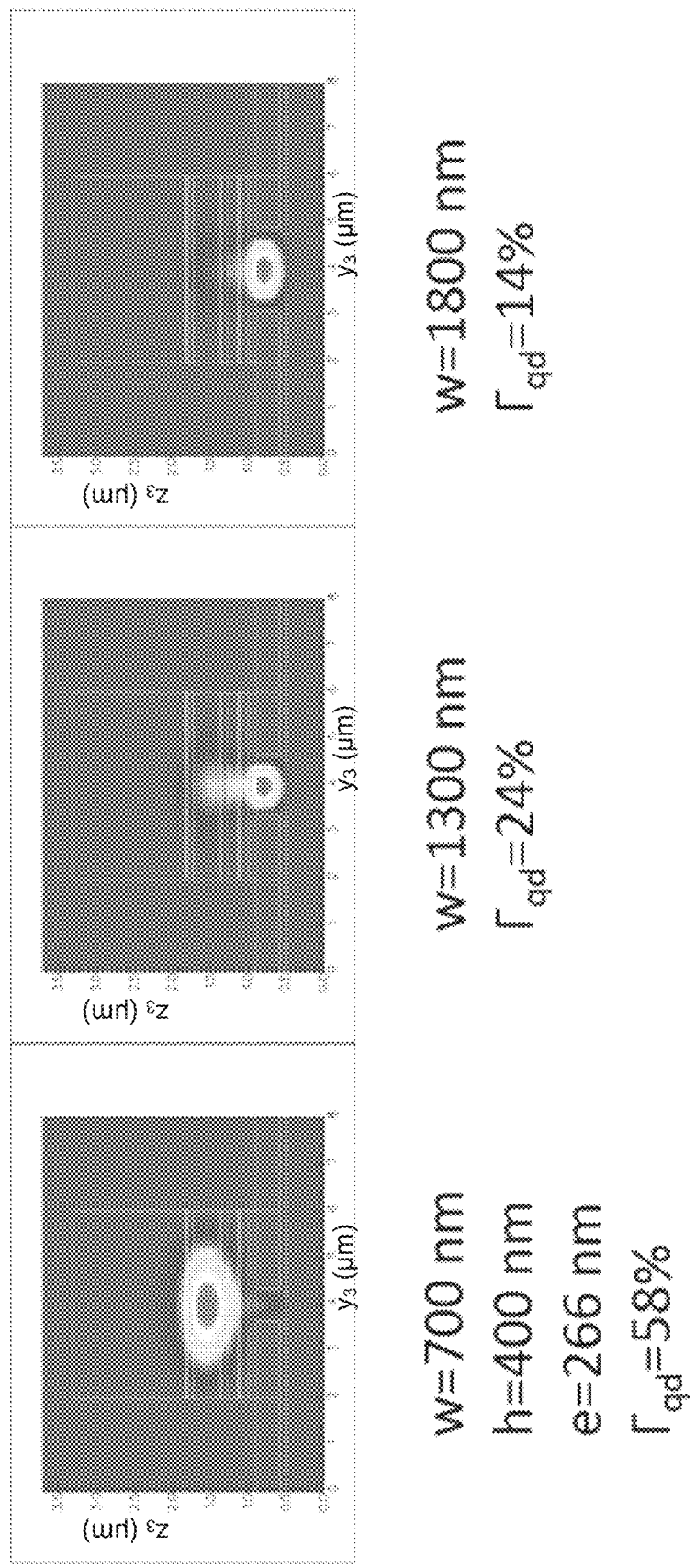

DEVICES WITH QUANTUM DOTS

STATEMENT OF GOVERNMENT INTEREST

This invention was made with government support under Agreement No. H98230-18-3-0001, and Contract No. H98230-12-C-0236 awarded by the Maryland Procurement Office. The government has certain rights in the invention.

BACKGROUND

Quantum dot containing materials may be used in various semiconductor devices. For example, quantum dot containing materials may be used as a gain material in a semiconductor laser. Quantum dots are unique in that they confine electrical carriers in three dimensions (quantum wells, on the other hand, confine electric carriers in two dimensions).

BRIEF DESCRIPTION OF THE DRAWINGS

FIGS. 2(A)-2(E) are conceptual diagrams illustrating an example semiconductor device at various manufacturing stages.

FIG. 3 is a process diagram illustrating another example process.

FIGS. 4(A)-4(E) are conceptual diagrams illustrating another example semiconductor device at various manufacturing stages.

FIG. 10 includes conceptual diagrams illustrating an optical mode of example semiconductor devices.

DETAILED DESCRIPTION

Disclosed herein are examples of semiconductor devices that contain quantum dots, along with methods of manufacturing such devices. The semiconductor devices may, for example, function as lasers, with the quantum dot containing material acting as the active laser material or gain material.

Figure 1:
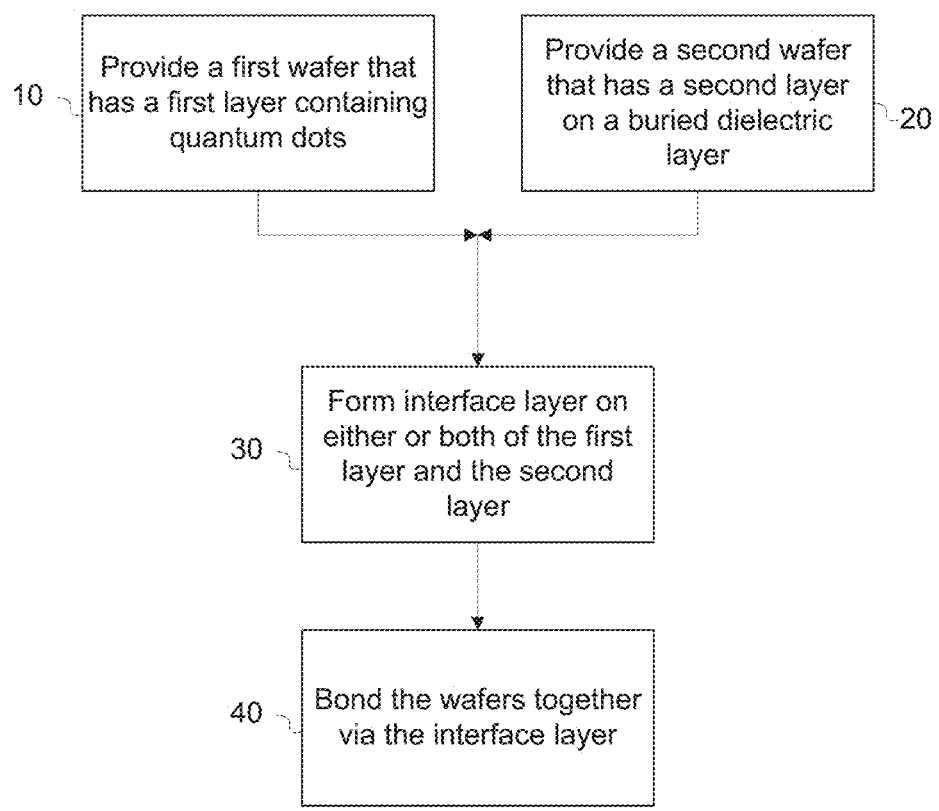
FIG. 1 is a process diagram illustrating an example process.

FIG. 1 is a process flow diagram illustrating an example process of manufacturing a semiconductor device. FIG. 2 is a conceptual diagram illustrating an example of a semiconductor device 400 that may be manufactured by the example process of FIG. 1, at various stages throughout the manufacturing process. FIGS. 1 and 2 will be described together for ease of understanding, but it should be understood that the example device 400 of FIG. 2 is merely one possible example of a semiconductor device that could be manufactured by the process of FIG. 1.

In process block 10, a first wafer 100, which has a first layer 101 that contains quantum dots, is provided. In this context, "providing" the first wafer 100 means having possession of and/or control over the first wafer 100. For example, "providing" the first wafer 100 may include forming some or all of the first wafer 100 from its constituent materials. As another example, "providing" the first wafer 100 may include obtaining possession of and/or control over an already-formed first wafer 100. FIG. 2(A) illustrates an example of the first wafer 100, which includes an example of the first layer 101 that contains quantum dots.

In certain examples, the first layer 101 may include more than one sub-layers. When more than one sub-layers are included in the first layer 101, the quantum dots do not necessarily have to be contained in each of the sub-layers. For example, a cladding layer(s) may be included in the first layer 101, which may facilitate injection of charge carriers into a sub-layer that contains the quantum dots, which may be referred to as an active layer. In such an example, the various sub-layers do not necessarily have to be made of the same host materials as one another.

For example, the first layer 101 illustrated in FIG. 2(A) includes a first cladding layer 101a, an active layer 101b, and a second cladding layer 101c. In this example, the quantum dots may be contained within the active layer 101b. In this example, the active layer 101b may be formed from a host semiconductor material that is different from a host material(s) of the cladding layers 101a and 101c, such that the layers 101a, 101b, and 101c form a double heterostructure. In this example, one of the cladding layers 101a and 101c may be n-doped while the other one of the cladding layers 101a and 101c may be p-doped, and the active layer 101b may be intrinsic (undoped), thus forming a p-i-n structure.

In certain examples, the first layer 101 may be formed from III-V semiconductor materials, in which case the first layer 101 may be referred to as a III-V material layer. For example, in the first layer 101 illustrated in FIG. 2(A), the cladding layers 101a and 101c may be formed from aluminum-gallium-arsenide ($Al_xGa_{1-x}As$), while the active layer 101b may be formed from a gallium-arsenide (GaAs) host material containing indium-arsenide (InAs) quantum dots. As another example, the active layer 101b may be formed from an indium-gallium-arsenide-phosphide ($In_{1-x}Ga_x$-$As_yP_{1-y}$) host material containing indium-arsenide (InAs) quantum dots. As another example, the active layer 101b may be formed from an indium-arsenide (InAs) host material containing Indium antimonide (InSb) quantum dots.

As another example, the active layer 101b may be formed from a zinc selenide (ZnSe) host material (a II-VI semiconductor material) containing cadmium selenide (CdSe) quantum dots.

The first wafer 100 may include additional layers (not illustrated) beyond the first layer 101. For example, the first layer 101 may be disposed on a substrate layer (not illustrated). As another example, a "handle" layer (not illustrated) that facilitates manipulating the first wafer 100 may be included in the first wafer 100 (in certain examples, a substrate layer and a handle layer may be the same layer). In FIG. 2, a layer stacking axis of the first wafer 100 is labeled $z_1$, which aligns with a direction in which the various layers of the first wafer 100 are stacked on each other. The layer stacking axis $z_1$ is part of a reference frame that is relative to the first wafer 100, and thus may change relative to an external reference frame as the first wafer 100 is moved relative to the external reference frame.

In process block 20, a second wafer 200, which has a second layer 203 that is disposed on a buried dielectric layer 202, is provided. In this context, "providing" the second wafer 200 means having possession of and/or control over the second wafer 200. For example, "providing" the second wafer 200 may include forming some or all of the second wafer 200 from its constituent materials. As another example, "providing" the second wafer 200 may include obtaining possession of and/or control over an already-formed second wafer 200. FIG. 2(B) illustrates an example of the second wafer 200, which includes an example of the second layer 203 and the buried dielectric layer 202.

In certain examples, the second wafer 200 may include a substrate 201. Any material may be used for the substrate 201, such as, for example, silicon (Si), glass, sapphire ($\alpha$-$Al_2O_3$), and so on.

In certain examples, the buried dielectric layer 202 may be any dielectric material layer that is sandwiched between the substrate 201 and the second layer 203. For example, the dielectric layer 202 may be a silicon-oxide ($Si_xO_y$), a silicon-nitride ($Si_xN_y$), a silicon-oxynitride ($Si_xO_yN_z$), and so on.

In certain examples, the second layer 203 may be a semiconductor layer. For example, the second layer 203 may be silicon (Si). In certain examples, the second layer 203 may be processed so as to include active and/or passive components or devices, such as transistors, capacitors, wave guides, and so on. For example, FIG. 5 illustrates a waveguide that may be formed in the second layer 203 (discussed in greater detail below). Such processing of the second layer 203 to include the aforementioned components/devices may be performed prior to performing operations of process block 30.

The second wafer 200 may include additional layers (not illustrated) beyond those described above. For example, a "handle" layer (not illustrated) that facilitates manipulating the second wafer 200 may be included in the second wafer 200 (in certain examples, the substrate layer 201 may function as a handle layer).

In FIG. 2, a layer stacking axis of the second wafer 200 is labeled $z_2$, which aligns with a direction in which the various layers of the second wafer 200 are stacked on each other. The layer stacking axis $z_2$ is part of a reference frame that is relative to the second wafer 200, and thus may change relative to an external reference frame as the second wafer 200 is moved relative to the external reference frame.

In process block 30, an interface layer 300 is formed on either or both of the first wafer 100 and the second wafer 200. In particular, the interface layer 300 is formed on either or both of the first layer 101 of the first wafer 100 and the second layer 203 of the second wafer 200. FIG. 2(C) illustrates an example in which the interface layer 300 is formed on both the first wafer 100 and the second wafer 200.

In certain examples, the interface layer 300 may be an insulator. As used herein and in the appended claims, an "insulator" is a material having a bandgap greater than 3 eV. For example, the interface layer 300 may be a dielectric material, such as an aluminum-oxide (e.g., $Al_2O_3$), a silicon-oxide (e.g., $SiO_2$), a silicon-nitride (e.g., $Si_3N_4$), spin-on glass, a polymer such as Benzocyclobutene ("BCB") ($C_8H_8$), and so on. In certain examples, the interface layer 300 may be a high-$\kappa$ dielectric; for example, the interface layer 300 may have a dielectric constant $\kappa$ (also referred to as relative permittivity $\varepsilon_r$) that is greater than or equal to approximately 7.

In certain examples, the interface layer 300 may be a transparent electrical conductor. As used herein and in the appended claims, "transparent" means having greater than 80% transmission through a 100 nm thick layer in wavelengths between 1200 nm and 1600 nm, and an "electrical conductor" is a material having a resistivity that is less than $2\times10^{-3}$ $\Omega$cm. For example, certain compositions of indium tin oxide ("ITO") (e.g., $In_xSi_yO_z$) are transparent electrical conductors that may be used for the interface layer 300.

In certain examples, the interface layer 300 may be a polymer. For example, the interface layer 300 may be a conductive polymer such as doped polyphenylene vinylene ("PPV").

The categories of insulator, dielectric, transparent electrical conductor, and polymer are not necessarily all mutually exclusive. For example, BCB may be considered to be an insulator, a dielectric, and a polymer. As another example, PPV may be considered to be both a transparent electrical conductor and a polymer.

In certain examples, the interface layer 300 may be disposed directly on the first layer 101, such that the interface layer 300 is in contact with and bonded to the first layer 101. In certain examples, the interface layer 300 may be disposed directly on the second layer 203, such that the interface layer 300 is in contact with and bonded to the second layer 203.

In certain examples, the interface layer 300 may completely cover the first layer 101 from a perspective on the layer-stacking axis $z_1$. In certain examples, the interface layer 300 may completely cover the second layer 203 from a perspective on the layer-stacking axis $z_2$.

The interface layer 300 may be formed on the first layer 101 and/or the second layer 203 by any technique. For example, the interface layer 300 may be deposited on the first layer 101 and/or the second layer 203 by physical vapor deposition (PVD), chemical vapor deposition (CVD), electrochemical deposition (ECD), molecular beam epitaxy (MBE), atomic layer deposition (ALD), spin-coating, and so on. In certain examples, the interface layer 300 may be formed on the first layer 101 and the second layer 203 simultaneously.

Hereinafter, the interface layer 300 may be referred to in the singular, regardless of whether the interface layer 300 is formed on one of the first wafer 100 and second wafer 200 or on both of the wafers 100/200. In examples in which the interface layer 300 is formed on both wafers 100/200, then the interface layer 300 may be considered as being a collection of parts—one part of the interface layer 300 corresponding to the first wafer 100 and one part of the interface layer 300 corresponding to the second wafer 200. These parts of the interface layer 300 may be physically separated from one another at certain stages of the example manufacturing process (e.g., at the conclusion of process block 30), but may be physically united at other stages of the example manufacturing process (e.g., at the conclusion of process block 40). Thus, when the interface layer 300 is formed on both wafers 100/200, references to "the interface layer 300" may refer collectively to both parts of the interface layer 300 unless specified otherwise.

In examples in which the interface layer 300 is formed on both the first layer 101 and the second layer 203, the two parts of the interface layer 300 may have different characteristics from one another. For example, the two parts of the interface layer 300 may have different thicknesses. As another example, the two parts of the interface layer 300 may be different materials. In such a case, upon the first wafer 100 being bonded to the second wafer 200, the two parts of the interface layer 300 that are bonded together may be considered collectively as a single interface layer 300 (despite possibly having some different characteristics).

In process block 40, the first wafer 100 and the second wafer 200 are bonded together via the interface layer 300. In particular, the first wafer 100 and second wafer 200 are brought into contact with each other, with at least one surface of the interface layer 300 serving as the point of contact between the two wafers 100/200. For example, one of the first wafer 100 and the second wafer 200 may be moved into alignment over the other wafer (for example, via a handle layer) and then may be lowered onto the other wafer. Once the two wafers 100/200 are in contact with each other at the interface layer 300, the two wafers 100/200 may be bonded to one another by means of the interface layer 300 forming various bonds, as described below.

For example, if the interface layer 300 was formed on the second layer 203 in block 30, then in process block 40 the interface layer 300 on the second wafer 200 may be brought into contact with the first layer 101 of the first wafer 100, and the interface layer 300 may be made to form bonds with the first layer 101. By this process, the first wafer 100 is bonded with the second wafer 200 to form a semiconductor device 400. In certain examples, the interface layer 300 may be such that it forms the aforementioned bonds with the first layer 101 automatically as a result of being brought into contact with the first layer 101. In certain examples, various processes may be performed, either before contact or after contact, to facilitate the formation of bonds between the interface layer 300 and the first layer 101, such as polishing surfaces of the interface layer 300 and/or the first layer 101 (e.g., chemical mechanical polishing), applying pressure to the wafers 100/200, applying heat to the wafers 100/200 (annealing), etc.

As another example, if the interface layer 300 is formed on the first layer 101 in block 30, then in process block 40 the interface layer 300 on the first wafer 100 may be brought into contact with the second layer 203 of the second wafer 200, and the interface layer 300 may be made to form bonds with the second layer 203. By this process, the first wafer 100 is bonded with the second wafer 200 to form a semiconductor device 400. In certain examples, the interface layer 300 may be such that it forms the aforementioned bonds with the second layer 203 automatically as a result of being brought into contact with second layer 203. In certain examples, various processes may be performed, either before contact or after contact, to facilitate the formation of bonds between the interface layer 300 and the second layer 203, such as polishing surfaces of the interface layer 300 and/or the second layer 203 (e.g., chemical mechanical polishing), applying pressure to the wafers 100/200, applying heat to the wafers 100/200 (e.g., annealing), etc.

As another example, if the interface layer 300 is formed on both the first layer 101 and on the second layer 203 in block 30, then in process block 40 the two parts of the interface layer 300 on the two wafers 100/200 may be brought into contact with each other, and the two parts of the interface layer 300 may be made to form bonds with one another. In this case, the two parts of the interface layer 300 that were previously physically separated from one another may be physically joined together as a result of forming the bonds with one another, and may be considered collectively as a single interface layer 300. By this process, the first wafer 100 is bonded with the second wafer 200 to form a semiconductor device 400. In certain examples, the two parts of the interface layer 300 may be such that they form the aforementioned bonds with one another automatically as a result of being brought into contact with each other. In certain examples, various processes may be performed, either before contact or after contact, to facilitate the formation of bonds between the two parts of the interface layer 300, such as polishing surfaces of the interface layer 300 (e.g., chemical mechanical polishing), applying pressure to the wafers 100/200, applying heat to the wafers 100/200 (e.g., annealing), etc. FIGS. 2(D)-(E) illustrate an example of bonding the first wafer 100 with the second wafer 200 in which the interface layer 300 was formed on both the first wafer 100 and the second wafer 200.

Upon completion of process block 40, a semiconductor device 400 is formed that has an interface layer 300 that is bonded to the first layer 101 on one side and to the second layer 203 on the other side.

In certain examples, the interface layer 300 in the finished semiconductor device 400 may be such that contact of the interface layer 300 with the first layer 101 and with the second layer 200 is uninterrupted. In this context, contact of the interface layer 300 with the first layer 101 and with the second layer 200 being uninterrupted means that the interface layer 300 is interposed between and in contact with the two layers in such a manner that there are no regions in which the first layer 101 is in direct contact with the second layer 200 and there are no portions of the interface layer 300 that are discontinuous from another portion of the interface layer 300. However, contact of the interface layer 300 with the first layer 101 and with the second layer 200 being uninterrupted should not be interpreted to exclude the possibility of there being regions in which the interface layer 300 is not present, such as at through-holes (vias) through the interface layer 300.

In certain examples, in the finished semiconductor device 400 the interface layer 300 may have a maximum thickness of around 300 nm or less, in a direction parallel to a layer stacking axis of the semiconductor device 400. In FIG. 2, a layer stacking axis of the semiconductor device 400 is labeled $z_3$, which aligns with a direction in which the various layers of the semiconductor device 400 are stacked on each other. After process block 40, the layer stacking axis $z_3$ is approximately parallel to the layer stacking axes $z_1$ and $z_2$, and approximately perpendicular to the substrate 201. The layer stacking axis $z_3$ is part of a reference frame that is relative to the semiconductor device 400, and thus may change relative to an external reference frame as the semiconductor device 400 is moved relative to the external reference frame.

In certain examples, the interface layer 300 may be substantially transparent to light; for example, the interface layer 300 may have an optical loss that is less than or equal to approximately 1 dB/cm.

In certain examples, the interface layer 300 may have high thermal conductivity; for example, the interface layer 300 may have a thermal conductivity that is greater than or equal to approximately 1 W/(m·K).

In certain examples, the interface layer 300 in the semiconductor device 400 may provide functionalities in addition to bonding the wafers 100/200 together. For example, the interface layer 300 might be used, in conjunction with other components (not illustrated) within the second layer 203 and/or the first layer 101 to form a device, such as a capacitor.

For example, a capacitor comprising the second layer 203 and the cladding layer 303 sandwiching the interface layer 300 therebetween may be formed by connecting the second layer 203 and the cladding layer 303 to metallic wirings. For example, a metallic contact (not illustrated) may be formed on the second layer 203, and another metallic contact (e.g., the metallic contact 107) may be formed on the second cladding layer 101c. When the semiconductor device 400 is processed to function as a laser, such a capacitor may be used to tune properties of the laser. In particular, a voltage may be applied across the capacitor, enabling electrical carriers to accumulate, deplete, or invert around the interface layer 300. An optical mode associated with the laser may overlap with the capacitor, and thus the modal index and modal loss of the laser may be changed by varying the voltage across the capacitor. The change in modal index and/or modal loss may be used for data modulation, optical attenuation or boost (e.g., free carrier absorption reduction), phase shifting (e.g., wavelength tuning), and so on.

FIG. 3 illustrates another example process of manufacturing a semiconductor device. FIG. 4 is a conceptual diagram illustrating an example of a semiconductor device 401 that may be manufactured by the example process of FIG. 3, at various stages throughout the manufacturing process. FIGS. 3 and 4 will be described together for ease of understanding, but it will be understood that the example device 401 of FIG. 4 is merely one possible example of a semiconductor device that could be manufactured by the process of FIG. 3.

Various features of the example process and the example semiconductor device 401 that are illustrated in FIGS. 3 and 4 may be similar to certain features of the example process and the example semiconductor device 400 that are illustrated in FIGS. 1 and 2, respectively. When a feature illustrated in FIG. 3 or 4 is similar to a feature illustrated in FIG. 1 or 2, respectively, the reference numeral used for that feature in FIG. 3 or 4 may be the same as the reference numeral that was used for the similar feature in FIG. 1 or 2, and duplicative description of the similar feature may be omitted.

In process block 10, a first wafer 100, which has a first layer 101 that contains quantum dots, is provided. This process block 10 is similar to process block 10 of FIG. 1, and thus duplicative description thereof is omitted. FIG. 4(A) illustrates an example of the first wafer 100, which includes an example of the first layer 101 that contains quantum dots. The first wafer 100 illustrated in FIG. 4(A) is similar to the first wafer 100 of FIG. 2, and thus duplicative description thereof is omitted.

In process block 50 a second wafer 200a, which has a dielectric layer 202a is provided. In this context, "providing" the second wafer 200a means having possession of and/or control over the second wafer 200a. For example, "providing" the second wafer 200a may include forming some or all of the second wafer 200a from its constituent materials. As another example, "providing" the second wafer 200a may include obtaining possession of and/or control over an already-formed second wafer 200. FIG. 4(B) illustrates an example of the second wafer 200a, which includes an example of the dielectric layer 202a.

In certain examples, the second wafer 200a may include a substrate 201. Any material may be used for the substrate 201, such as, for example, silicon (Si), glass, sapphire ($\alpha$-Al$_2$O$_3$), and so on.

The dielectric layer 202a may be a dielectric material, such as, for example, a silicon-oxide (Si$_x$O$_y$), a silicon-nitride (Si$_x$N$_y$), a silicon-oxynitride (Si$_x$O$_y$N$_z$), and so on.

In process block 60, an interface layer 300a is formed on either or both of the first wafer 100 and the second wafer 200a. In particular, the interface layer 300a is formed on either or both of the first layer 101 of the first wafer 100 and the dielectric layer 202a of the second wafer 200. FIG. 4(C) illustrates an example in which the interface layer 300a is formed on both the first wafer 100 and the second wafer 200a.

In certain examples, the interface layer 300a may be a material that is a different material from that of the dielectric layer 202a and is one of: an insulator, a transparent electrical conductor, and a polymer. For example, the interface layer 300 may be a dielectric material, such as an aluminum-oxide (e.g., Al$_2$O$_3$), a silicon-oxide (e.g., SiO$_2$), a silicon-nitride (e.g., Si$_3$N$_4$), spin-on glass, a polymer such as Benzocyclobutene ("BCB") (C$_8$H$_8$), and so on, which is different from a dielectric material of the dielectric layer 202a. In certain examples, the interface layer 300a may be a high-$\kappa$ dielectric; for example, the interface layer 300 may have a dielectric constant $\kappa$ (also referred to as relative permittivity $\varepsilon_r$) that is greater than or equal to approximately 7.

In certain examples, the interface layer 300a may be a transparent electrical conductor. For example, the interface layer 300a may be ITO.

In certain examples, the interface layer 300a may be a polymer. For example, the interface layer 300a may be a conductive polymer such as PPV.

In certain examples, the interface layer 300a may be disposed directly on the first layer 101, such that the interface layer 300a is in contact with and bonds to the first layer 101. In certain examples, the interface layer 300a may be disposed directly on the dielectric layer 202a, such that the interface layer 300 is in contact with and bonds to the dielectric layer 202a.

In certain examples, the interface layer 300a may completely cover the first layer 101 from a perspective on the layer-stacking axis $z_1$. In certain examples, the interface layer 300a may completely cover the dielectric layer 202a from a perspective on the layer-stacking axis $z_2$.

The interface layer 300a may be formed on the first layer 101 and/or the dielectric layer 202a by any technique. For example, the interface layer 300a may be deposited on the first layer 101 and/or the dielectric layer 202a by physical vapor deposition (PVD), chemical vapor deposition (CVD), electrochemical deposition (ECD), molecular beam epitaxy (MBE), atomic layer deposition (ALD), spin-coating, and so on. In certain examples, the interface layer 300a may be formed on the first layer 101 and the dielectric layer 202a simultaneously.

Hereinafter, the interface layer 300a may be referred to in the singular, regardless of whether the interface layer 300a is formed on only one of the first wafer 100 and second wafer 200a or on both of the wafers 100/200a. In examples in which the interface layer 300a is formed on both wafers 100/200a, then the interface layer 300a may be considered as being a collection of parts-one part of the interface layer 300a corresponding to the first wafer 100 and one part of the interface layer 300a corresponding to the second wafer 200a. These parts of the interface layer 300a may be physically separated from one another at certain stages of the example manufacturing process (e.g., at the conclusion of process block 60), but may be physically united at other stages of the example manufacturing process (e.g., at the conclusion of process block 40). Thus, when the interface layer 300a is formed on both wafers 100/200a, a reference to "the interface layer" may refer collectively to both parts of the interface layer 300a regardless of the stage of the manufacturing process, unless specified otherwise.

In examples in which the interface layer 300a is formed on both the first layer 101 and the dielectric layer 202a, the two parts of the interface layer 300a may have different characteristics from one another. For example, the two parts of the interface layer 300a may have different thicknesses. As another example, the two parts of the interface layer 300a may be different materials. In such a case, upon the first wafer 100 being bonded to the second wafer 200a, the two parts of the interface layer 300a that are bonded together may be considered collectively as a single interface layer 300a (despite possibly having some different characteristics).

In process block 40, the first wafer 100 and the second wafer 200a are bonded together via the interface layer 300a. In particular, the first wafer 100 and second wafer 200a are brought into contact with each other, with at least one surface of the interface layer 300a serving as the point of contact between the two wafers 100/200a. For example, one of the first wafer 100 and the second wafer 200a may be moved into alignment over the other wafer (for example, via a handle layer) and then may be lowered onto the other wafer. Once the two wafers 100/200a are in contact with each other at the interface layer 300a, the two wafers 100/200a may be bonded to one another by means of the interface layer 300a forming various bonds. This process block 40 is similar to process block 40 of FIG. 1, except that the second wafer 200a is used instead of the second wafer 200, and thus duplicative description thereof is omitted.

FIGS. 4(D)-(E) illustrate an example of the first wafer 100 being bonded to the second wafer 200a to form a semiconductor device 401. The semiconductor device 401 illustrated in FIG. 4(A) is similar to the semiconductor device 400 of FIG. 2, except that the semiconductor device 401 does not include the second layer 203 and includes the interface layer 300a and the dielectric layer 202a instead of the interface layer 300 and the buried dielectric layer 202. Thus duplicative description of the other features of the semiconductor device 401 is omitted.

In certain examples, in the finished semiconductor device 401 the interface layer 300a may have a maximum thickness of around 300 nm or less, in a direction parallel to a layer stacking axis of the semiconductor device 401. In FIG. 4, a layer stacking axis of the semiconductor device 401 is labeled $z_3$, which aligns with a direction in which the various layers of the semiconductor device 401 are stacked on each other. After process block 60, the layer stacking axis $z_3$ is approximately parallel to the layer stacking axes $z_1$ and $z_2$, and approximately perpendicular to the substrate 201. The layer stacking axis $z_3$ is part of a reference frame that is relative to the semiconductor device 401, and thus may change relative to an external reference frame as the semiconductor device 401 is moved relative to the external reference frame.

In certain examples, the interface layer 300a may be substantially transparent to light; for example, the interface layer 300a may have an optical loss that is less than or equal to approximately 1 dB/cm.

In certain examples, the interface layer 300a may have high thermal conductivity; for example, the interface layer 300a may have a thermal conductivity that is greater than or equal to approximately 1 W/(m·K).

In certain examples, the interface layer 300a in the semiconductor device 400 may provide functionalities in addition to bonding the wafers 100/200a together. For example, the interface layer 300a might be used, in conjunction with other components (not illustrated) within the first layer 101 to form a device, such as a capacitor.

In the example semiconductor devices described above, a quantum dot containing material (e.g., first layer 101) may be combined with materials (e.g., second wafer 200/200a) that are of a different class than the quantum dot containing material. For example, when the first layer 101 is based on direct-bandgap semiconductor materials (such as a direct bandgap III-V semiconductor material), the second wafer 200/200a may be based on indirect bandgap semiconductor materials (such as silicon based materials). In certain circumstances, the class of materials used in the second wafer 200/200a (e.g., silicon) may be cheaper, stronger, larger, or otherwise more desirable to use as a substrate for the semiconductor device than the class of materials used in the first layer 101 (e.g., III-V semiconductor materials). However, forming the quantum dot containing material directly on the second wafer 200/200a might be difficult, costly, or produce unacceptable results, since, for example, differences between the materials may cause defects in the quantum dots when it is attempted to form the quantum dot material on the second substrate 200/200a. Thus, by forming the quantum dot containing material separately (e.g., forming the first wafer 100), and then transferring the quantum dot containing material to the other materials (e.g., the second wafer 200/200a), it is possible to avoid the defects that might occur if the quantum dots were formed directly thereon.

In addition, by using the interface layer 300/300a to bond the first wafer 100 to the second wafer 200/200a, a strong bond may be obtained at low temperature. In addition, because the interface layer 300/300a is one of an insulator, a transparent electrical conductor, and a polymer, the semiconductor device may have lower optical loss than if a metal-metal or metal-semiconductor bond interface were used. In addition, use of the interface layer 300/300a to bond the first wafer 100 to the second wafer 200/200a may provide superior heat dissipation in the semiconductor device, as the interface layer 300/300a may have a relatively high thermal conductivity. In addition, the interface layer 300/300a may provide additional functionalities, such as tuning optical properties of the semiconductor device.

Figure 5A:
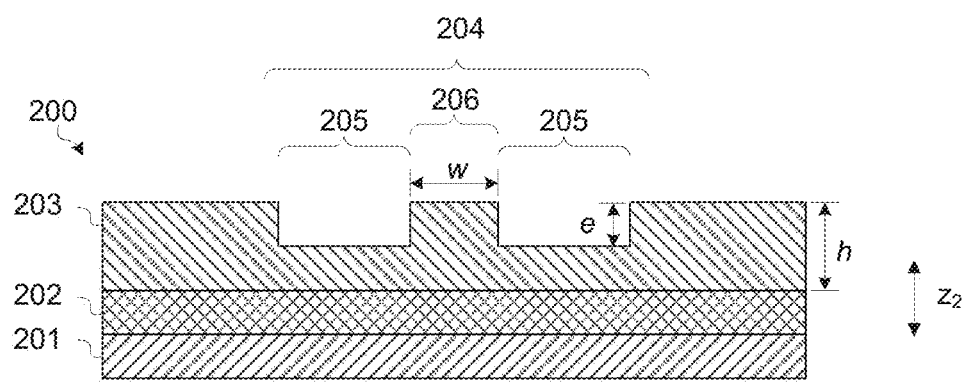
FIGS. 5(A) and 5(B) are a conceptual diagram illustrating example waveguides.
Figure 5B:
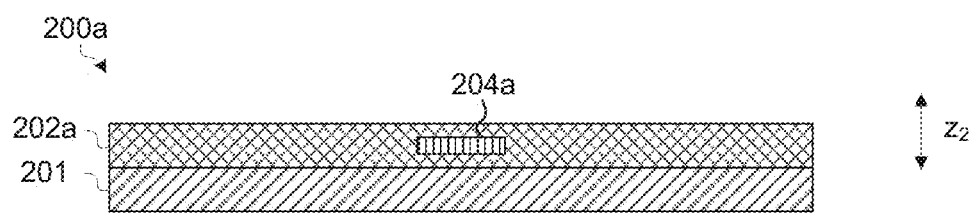

The semiconductor devices formed by the example processes discuss above, such as the semiconductor devices 400 and 401, may include various active and/or passive components, such as a waveguide. FIGS. 5(A) and 5(B) illustrate examples of such waveguides, which may be formed in the second wafer 200 and the second wafer 200a, respectively.

FIG. 5(A) illustrates an example of a rib-type waveguide 204 that may be formed in the second layer 203 of the second wafer 200. The waveguide 204 may be formed, for example, by etching a pattern into the second layer 203 prior to depositing the interface layer 300. For example, trenches 205 may be etched into the second layer 203, and thereby a rib(s) 206 for a rib-waveguide may be defined. As illustrated in FIG. 5(A), the rib(s) 206 may have a width denoted by w, and the trenches 205 may have an etch depth denoted by e. A maximum thickness of the second layer 203 may be denoted by h. By setting values for the parameters w, e, and h, various optical properties of the waveguide 204 may be tuned. Examples of tuning the properties of the waveguide 204 will be discussed below with respect to FIG. 10.

FIG. 5(B) illustrates an example of a buried waveguide 204a that may be formed in the dielectric layer 202a of the second wafer 200a. For example, the dielectric layer 202a may be a low index material, such as silicon oxide ($SiO_2$), and the buried waveguide 204a may be formed from a higher index material, such as silicon oxinitride ($SiO_xN_y$). The waveguide 204a may be formed by, for example, implanting materials into a particular portion of the dielectric layer 202a while the dielectric layer 202a is being formed. For example, the implanted materials may be materials that, when implanted into a portion of the dielectric layer 202a, cause that portion of the dielectric layer 202a to have a higher index relative to the rest of the dielectric layer 202a (e.g., nitrogen in the example in which the dielectric layer 202a is $SiO_2$).

Although FIGS. 5(A) and 5(B) illustrate a rib-type waveguide 204 and a buried waveguide 204a, these are merely examples, and any type of waveguide (or no waveguide at all) could be included in a semiconductor device manufactured by the above-describe processes.

The example semiconductor devices described herein, such as the semiconductor devices 400 and 401, may function as lasers, with the quantum dots contained in the first layer 101 acting as the light-emitting material (also known as gain material, active material, or active laser medium) of the laser. In particular, charge carriers may be injected from metal contacts through the cladding layers 101a and 101c into the active region 101b, which contains the quantum dots, and the charge carriers may combine to generate light. Certain processes in addition to those processes described above with regard to FIGS. 1 and 3 may be performed with respect to the example semiconductor devices in order to enable the semiconductor devices to function as lasers.

Figure 6:
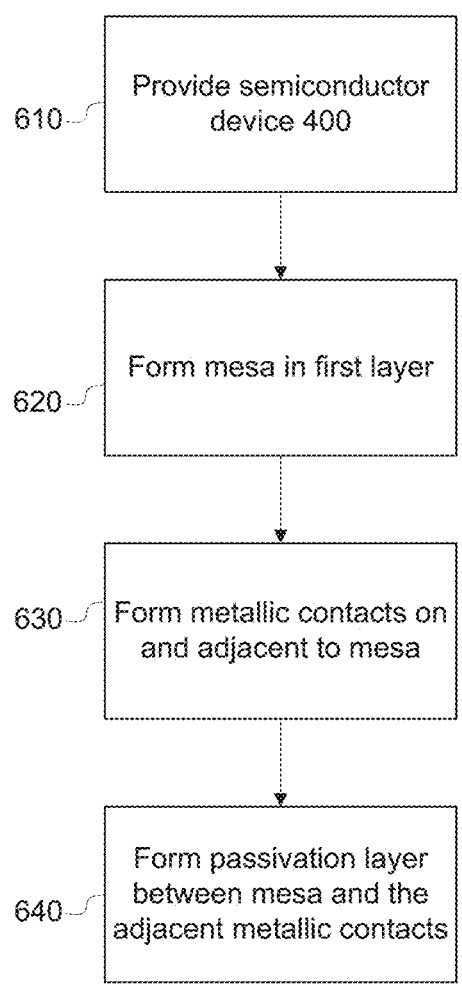
FIG. 6 is a process diagram illustrating another example process.
Figure 7:
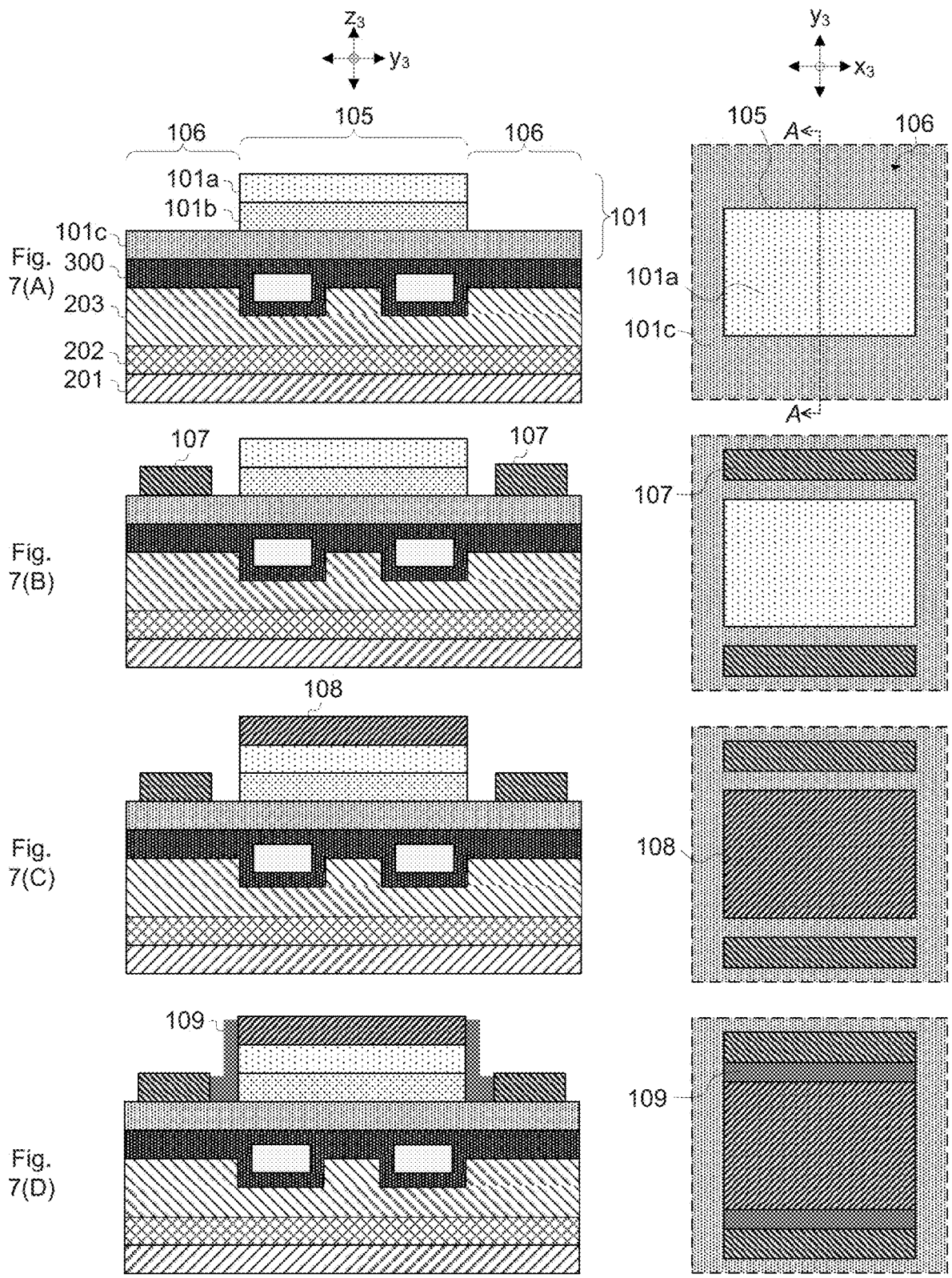
FIGS. 7(A)-7(D) are conceptual diagrams illustrating another example semiconductor device at various manufacturing stages.
Figure 8:
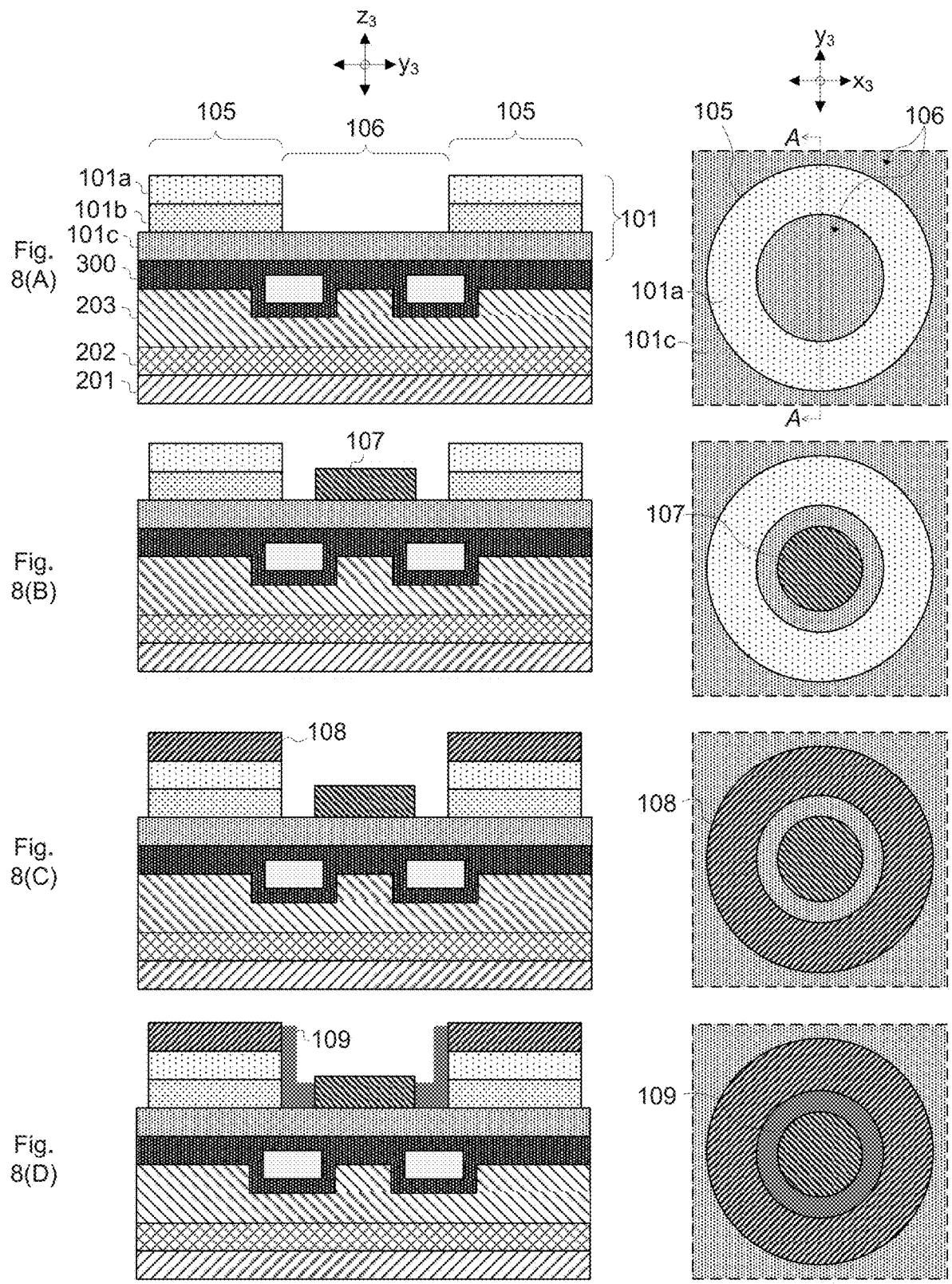
FIGS. 8(A)-8(D) are conceptual diagrams illustrating another example semiconductor device at various manufacturing stages.

For example, FIG. 6 illustrates an example process for enabling any of the example semiconductor devices described herein to function as a laser. FIGS. 7-8 illustrate two different examples of how the example semiconductor device 400 may be processed according to the process of FIG. 6. FIGS. 6-8 will be described together for ease of understanding, but it should be understood that the examples illustrated in FIGS. 7 and 8 are merely two possible examples of how a semiconductor device could be processed to function as a laser according to the process of FIG. 6.

In each of FIGS. 7 and 8, cross-sectional views of the semiconductor device 400 in an $y_3$-$z_3$ plane are shown on a left side of the figure, while on a right side of the figure corresponding views of the semiconductor device 400 from a perspective on the $z_3$ axis above the device 400 are shown. The cross-sectional views correspond to a cross-section taken along the line A, which is approximately parallel to a $y_3$-axis. The $x_3$-axis and the $y_3$-axis illustrated in FIGS. 7 and 8 are both approximately parallel to the substrate 201, and all of the axes $x_3$, $y_3$, and $z_3$ are mutually orthogonal. Recall that the $z_3$-axis is a layer stacking axis that is parallel to the layer stacking direction in the semiconductor device 400.

In process block 610, the semiconductor device 400 is provided. In this context, "providing" the semiconductor device 400 means having possession of and/or control over the semiconductor device 400. For example, "providing" the semiconductor device 400 may include forming some or all of the semiconductor device 400 (such as by performing the process of FIG. 1). As another example, "providing" the semiconductor device 400 may include obtaining possession of and/or control over an already-formed semiconductor device 400. FIG. 2(E) illustrates an example of the semiconductor device 400 as it might appear in process block 610.

In certain examples, the semiconductor device 400 may include a waveguide in one of its constituent layers. For example, FIGS. 7-8 illustrate the semiconductor device 400 as having a waveguide corresponding to the waveguide illustrated in FIG. 5. However, any other type of waveguide could also be included in the semiconductor device 400. Moreover, in certain examples the semiconductor device 400 does not have any waveguide.

The semiconductor device 400 may also include various layers that are not illustrated in FIG. 2(E), such as a layer that previously served as a substrate of the first wafer 100 (prior to the wafers 100 and 200 being bonded) or a handle layer. In such a case, certain of these layers may be removed before proceeding to process block 620 (if they were not removed previously); in particular, layers that cover the first cladding layer 101a may be removed.

In process block 620, a mesa 105 is formed in the first layer 101. For example, the mesa 105 may be formed by selectively etching the first layer 101 so as to remove the layers 101a and 101b in regions 106 while retaining the layers 101a and 101b in a region corresponding to the mesa 105. FIG. 7(A) illustrates an example in which the mesa 105 has a shape of (roughly) a rectangular parallelepiped that extends in the $z_3$ direction away from the layer 101c, with the region 106 surrounding the mesa 105. FIG. 8(A) illustrates an example in which the mesa 105 has a shape that is roughly an annular cylinder that extends in the $z_3$ direction away from the layer 101c, with a region 106 that surrounds the mesa 105 and a region 106 forming a hollowed-out region within the mesa 105. These mesas 105 are merely examples, and other configurations could be used, such as cylindrically shaped mesas 105, star shaped mesas 105, and so on. Hereinafter, the mesa 105 of FIG. 7 may occasionally be referred to as a column mesa 105 and the mesa 105 of FIG. 8 may occasionally be referred to as a ring mesa 105.

In process block 630, metallic contacts 107/108 are formed adjacent to, and on, the mesa 105. In particular, the metallic contact 107 may be formed adjacent to the mesa 105, while the metallic contact 108 may be formed on the mesa 105. The metallic contact 107 may be in contact with the second cladding layer 101c, while the metallic contact 108 may be in contact with the first cladding layer 101a. The materials of the metallic contacts 107/108 may be selected so as to match the particular sub-layers of the first layer 101 that they are in contact with. For example, the materials of the metallic contacts 107/108 may be selected so as to allow them to form ohmic contacts with the respective cladding layers 101a/101c to which they are connected.

FIG. 7(B) illustrates the metallic contacts 107 in the shape of (roughly) rectangular parallelepipeds that extend along the base of the column mesa 105 on two sides thereof. Although FIG. 7(B) shows two metallic contacts 107 along two sides of the column mesa 105, more or fewer metallic contacts 107 could be used along more or fewer sides of the column mesa 105. For example, a single metallic contact 107 may completely surround the column mesa 105. FIG. 7(C) illustrates the metallic contact 108 in the shape of (roughly) a rectangular parallelepiped covering the top of the column mesa 105. Although FIG. 7(C) shows one metallic contact 108 that covers the top surface of the column mesa 105, multiple smaller metallic contacts 108 could be included on the column mesa 105 and the metallic contact(s) 108 do not necessarily have to cover the entire top surface of the column mesa 105. Moreover, the metallic contacts 107/108 can be any shape.

FIG. 8(B), illustrates the metallic contact 107 in the shape of a cylinder that is within the hollowed-out portion of the ring mesa 105 and surrounded by the ring mesa 105. FIG. 8(C), illustrates the metallic contact 108 in the shape of an annular cylinder covering the top of the ring mesa 105. Although FIG. 8(C) shows one metallic contact 108 that completely surrounds the ring mesa 105, multiple smaller metallic contacts 108 could be spaced around the ring mesa 105 and the metallic contact(s) 108 do not necessarily have to completely surround the entire ring mesa 105. Moreover, the metallic contacts 107/108 can be any shape.

In process block 640, a passivation layer 109 may be formed between the mesa 105 and the metallic contacts 107 that are adjacent to the mesa 105. The passivation layer 109 may be, for example, a dielectric material. The passivation layer 109 may protect the layers 101c, 101b, and 101a. The passivation layer 109 may also provide some electrical insulation in the region immediately between the metallic contacts 107 and 108, thereby reducing a number of charge carriers that bypass the active layer 101b when flowing between the metallic contacts 107 and 108, and increasing the number of charge carriers that flow into the active layer 101b.

FIGS. 7(D) and 8(D) illustrate the passivation layer 109 disposed between the metallic contacts 107 and 108. Although not illustrated, the passivation layer 109 may also be disposed on the second cladding layer 101c in the regions surrounding the exterior of the laser.

Although FIGS. 7 and 8 illustrate examples in which the semiconductor device 400 is processed to function as a laser, the other example semiconductor devices described herein (such as the semiconductor device 401) could also be processed to function as a laser in similar fashion. For example, the process of FIG. 6 could be applied to the semiconductor device 401 in the same manner as described above, with the exception that in process block 610 the semiconductor device 401 is provided instead of the semiconductor device 400.

Figure 9:
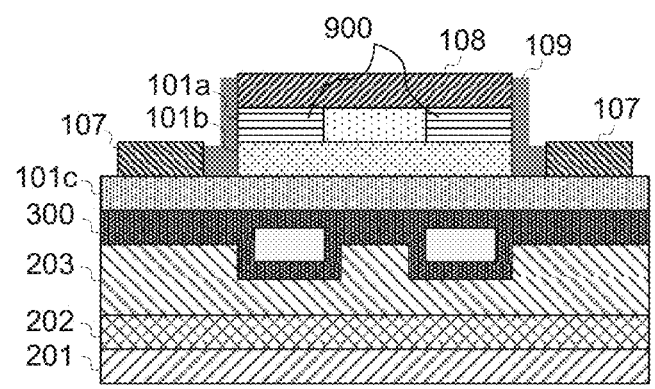
FIG. 9 is a conceptual diagram illustrating another example semiconductor device.

Moreover, various features of the semiconductor devices illustrated in FIGS. 7 and 8 could be omitted, and additional features could be added. For example, although the example semiconductor devices in FIGS. 7 and 9 are illustrated with a particular waveguide, the semiconductor devices could have a different type of waveguide or even no waveguide at all. As another example, components not illustrated in the figures, such as capacitors, transistors, and the like, could be included in the semiconductor devices.

FIG. 9 illustrates another example of the semiconductor device 400, which has been processed according to the process of FIG. 6 to function as a laser. The example semiconductor device 400 illustrated in FIG. 9 is similar to the example semiconductor device 400 illustrated in FIG. 7, with the exception that the semiconductor device 400 illustrated in FIG. 9 includes proton implants 900. In particular, protons may be implanted into portions of the first cladding layer 101a to form the proton implants 900, which may further define a current channel for current flowing between the metallic contacts 107/108. The protons may be implanted in the first cladding layer 101a at any point in the manufacturing process at which the first cladding layer 101a is accessible. For example, the protons may be implanted while the first wafer 100 is being manufactured, after the first wafer 100 has been manufactured but before the first wafer and the second wafer have been bonded together, after the first wafer and the second wafer have been bonded together but before formation of the mesa 105, or after formation of the mesa 105. Duplicative description of the other features of the semiconductor device 400 illustrated in FIG. 9 is omitted.

Although the proton implants 900 are illustrated in FIG. 9 using the semiconductor device 400 as an example, they could also be included in any other of the example semiconductor devices described herein (such as the semiconductor device 401).

FIG. 10 illustrates examples of semiconductor devices 400 that include waveguides 204 and have been processed to function as a laser. FIG. 10 demonstrates how optical properties of the laser may be tuned by setting the parameters w, e, and h of the waveguide 204. In particular, the overlap of an optical mode with the active layer 101b (which contains the quantum dots) can be tuned by setting the parameters w, e, and h. In FIG. 10, the values of h and e are fixed in each of the illustrated examples (h=400 nm and e=266 nm), while the value of w is changed between w=700 nm, w=1300 nm, and w=1800 nm. In a left-most diagram, w=700 nm and the optical mode has a confinement factor of 58% within the active layer 101b. In the center diagram, w=1300 nm and the optical mode has a confinement factor of 24% within the active layer 101b. In the right-most diagram, w=1800 nm and the optical mode has a confinement factor of 14% within the active region 101b.

In certain examples, the parameters w, e, and h may be set such that 100 nm≥w≥5000 nm, 10 nm≥e≥4500 nm, and 200 nm≥h≥900 nm. In certain examples, h is approximately 400 nm (±10%), e is approximately 266 nm (±10%), and w is approximately 700-1800 nm.

Various specific examples of semiconductor devices have been described above. However, these examples are not limiting. While the above disclosure has been shown and described with reference to the foregoing examples, it should be understood that other forms, details, and implementations may be made without departing from the spirit and scope of this disclosure. For example, various features described with respect to one example device may be interchangeably included in other example devices with respect to which those features were not explicitly described above. Moreover, features that were described with respect to an example device may be omitted from that same device. For example, each of the semiconductor devices 400 and 401 described above may include a waveguide, not include a waveguide, include the proton implants 900, not include the proton implants 900, or any combination of these.

What is claimed is:

1. A semiconductor device, comprising: a substrate; a buried dielectric layer on the substrate; a second layer on the buried dielectric layer; an interface layer on the second layer; and a first layer that contains quantum dots on the interface layer, a laser comprising the quantum dots as a light generating material; a capacitor that configured to tune the laser, the capacitor comprising a portion of a cladding layer of the first layer, a portion of the interface layer, and a portion of the second layer, wherein the interface layer is one of: an insulator and a polymer, and contact of the interface layer with the second layer and the first layer is uninterrupted.

2. The semiconductor device of claim 1,
wherein the laser includes metallic contacts in proximity to a region of the first layer that contains the quantum dots such that electrical carriers are injectable from the metallic contacts into the region to cause the quantum dots to emit light, and
wherein the second layer includes a wave guide for the laser.

3. The semiconductor device of claim 1, wherein the interface layer is a dielectric material.

4. The semiconductor device of claim 1, wherein the first layer includes an active layer that contains the quantum dots and the cladding layer on the active layer.

5. The semiconductor device of claim 1, wherein the second layer is a patterned waveguide for the laser.

* * * * *